United States Patent [19]

Poole et al.

[11] Patent Number: 5,162,251
[45] Date of Patent: Nov. 10, 1992

[54] METHOD FOR MAKING THINNED CHARGE-COUPLED DEVICES

[75] Inventors: Richard R. Poole, Norwalk; Enrique Garcia, Sandy Hook, both of Conn.

[73] Assignee: Hughes Danbury Optical Systems, Inc., Danbury, Conn.

[21] Appl. No.: 670,841

[22] Filed: Mar. 18, 1991

[51] Int. Cl.⁵ .................. H01L 21/58; H01L 21/339
[52] U.S. Cl. .................. 437/53; 437/226; 437/974; 437/86; 437/225; 148/DIG. 12; 148/DIG. 135
[58] Field of Search ............ 437/53, 226, 974, 86, 437/225; 148/DIG. 135, DIG. 12

[56] References Cited

U.S. PATENT DOCUMENTS

| | | | |
|---|---|---|---|
| 3,965,568 | 6/1976 | Gooch | 437/974 |
| 4,197,633 | 4/1980 | Lorenze, Jr. et al. | 437/53 |
| 4,266,334 | 5/1981 | Edwards et al. | 437/974 |
| 4,321,747 | 3/1982 | Takemura et al. | 437/974 |
| 4,465,549 | 8/1984 | Ritzman | 437/974 |
| 4,814,283 | 3/1989 | Temple et al. | 437/53 |
| 4,876,222 | 10/1989 | Luttmer et al. | 437/235 |

FOREIGN PATENT DOCUMENTS 0032565  7/1981  European Pat. Off. ......... 437/53

*Primary Examiner*—Olik Chaudhuri
*Assistant Examiner*—G. Fourson
*Attorney, Agent, or Firm*—W. K. Denson-Low; W. J. Streeter; R. A. Hays

[57] ABSTRACT

A standard thick silicon charge-coupled device (FIG. 1A) has its pixel face mounted to a transparent, optically flat glass substrate using a thin layer of thermoset epoxy. The backside silicon of the charge-coupled device is thinned to 10 ±0.5 um using a two-step chemi-mechanical process. The bulk silicon is thinned to 75 um with a 700 micro-grit aluminium oxide abrasive and is then thinned and polished to 10 um using 80 nm grit colloidal silica. Access from the backside to the aluminum bonding pads (36 of FIG. 5) of the device is achieved by photolithographic patterning and reactive ion etching of the silicon above the bonding pads. The charge-coupled device is then packaged and wire-bonded in a structure which offers support for the silicon membrane and allows for unobstructed backside illumination.

18 Claims, 3 Drawing Sheets

2. BOND CCD CHIPS

3. THIN SILICON

5. CUT TO SIZE

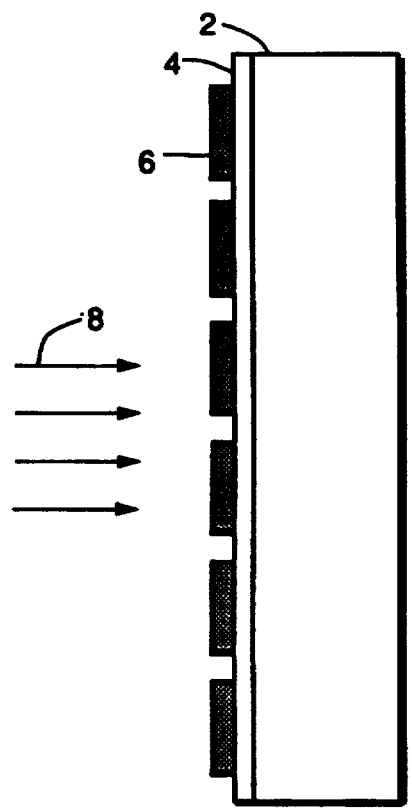
FIG. 1a.
(PRIOR ART)
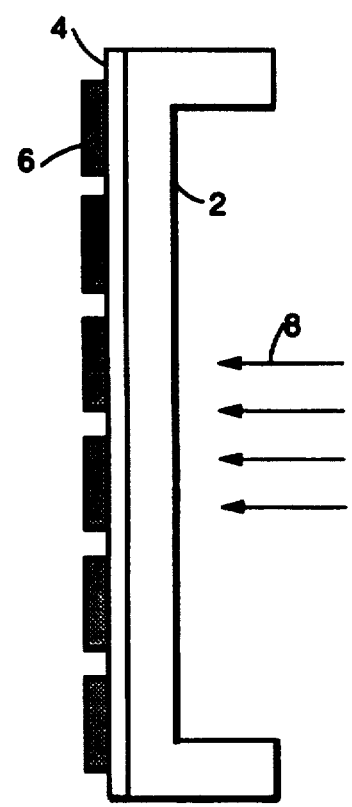
FIG. 1b.
(PRIOR ART)
FIG. 5.
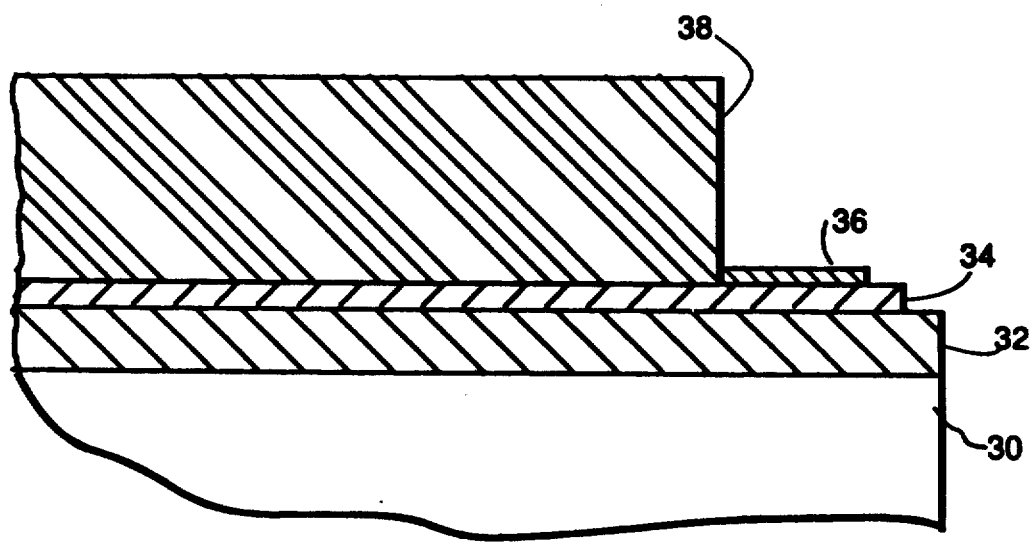

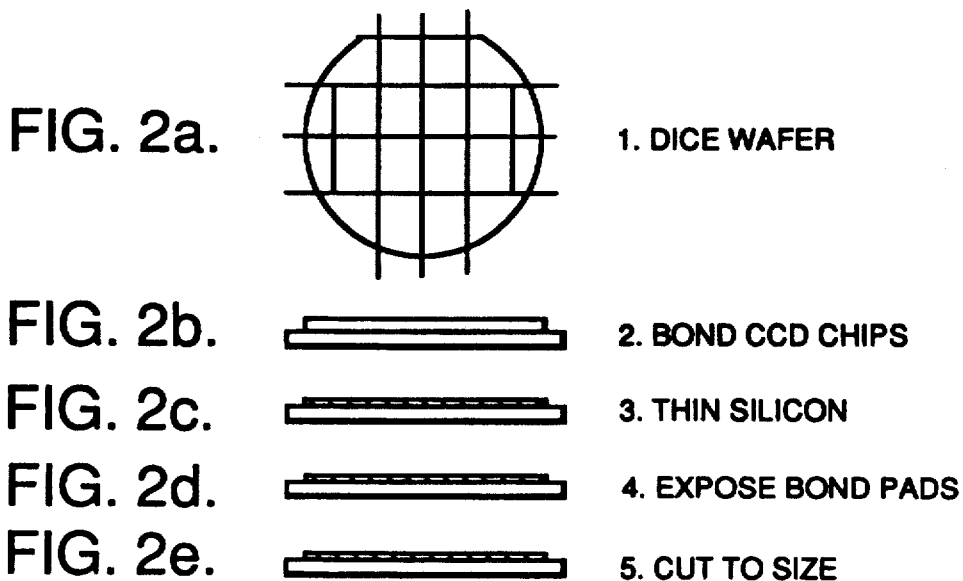
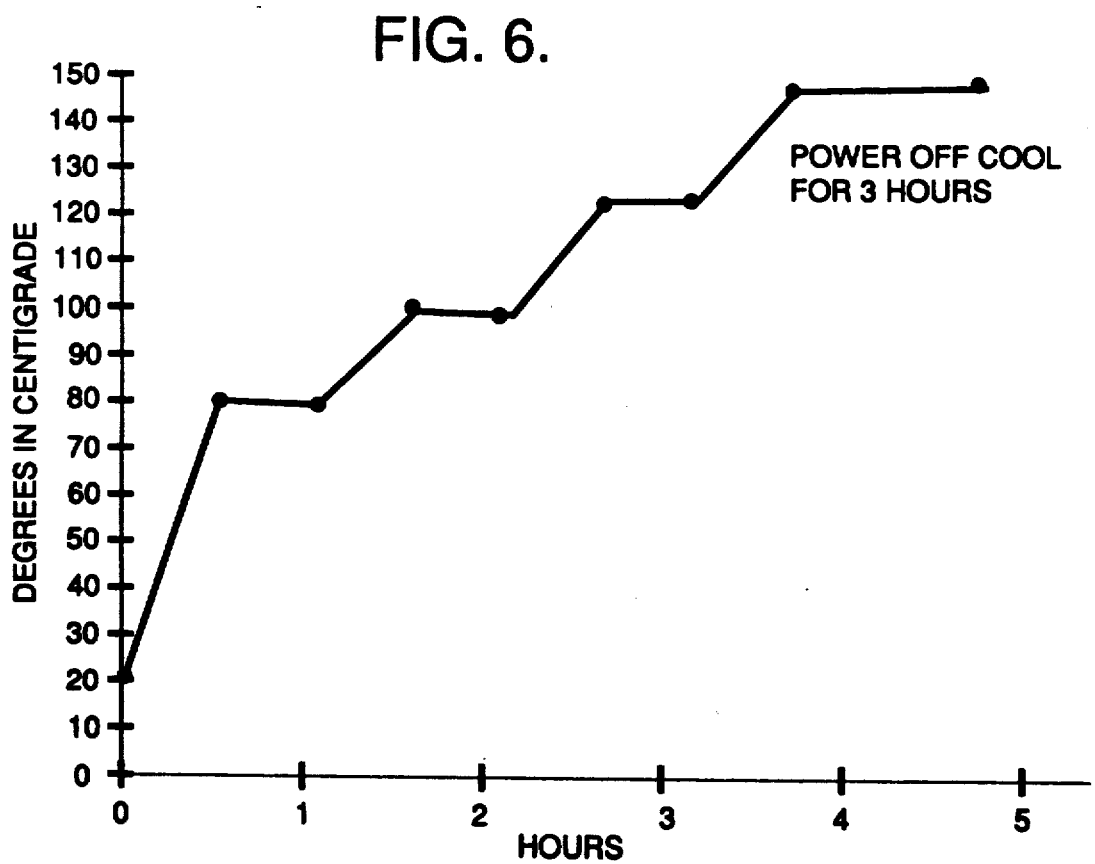

METHOD FOR MAKING THINNED CHARGE-COUPLED DEVICES

BACKGROUND OF THE INVENTION

1. Field of the Invention

The present invention relates to charge-coupled devices and in particular, such devices which are thinned to allow illumination of the backside of the device to improve quantum efficiency and UV spectral response. The invention is particularly directed towards an improved method for thinning such charge-coupled devices.

2. Description of the Prior Art

Charge-coupled devices are typically made of silicon and are used as solid-state imagers by taking advantage of the properties of a silicon crystal lattice. In the crystalline form, each atom of silicon is covalently bonded to its neighbor. Energy greater than the energy gap of about 1.1 eV is required to break a bond and create an electron hole pair. Incident electromagnetic radiation in the form of photons of wavelength shorter than 1 um can break the bonds and generate electron hole pairs.

The wavelength of incoming light and the photon absorption depth are directly related, the shorter the wavelength, the shorter the penetration depth into the silicon. Silicon becomes transparent at a wavelength of approximately 1100 nm and is essentially opaque to light at wavelengths shorter than 400 nm. High energy particles, X-rays and cosmic rays can break many thousands of bonds; therefore, excessive exposure can cause damage to the crystal lattice. Bonds can also be broken by thermal agitation. At room temperature, approximately 50 bonds per second per $um^3$ are broken and recombined on a continuous basis. The rate of electron hole pair generation due to thermal energy is highly temperature-dependent and can be reduced arbitrarily through cooling.

In order to measure the electronic charge produced by incident photons, it was required to provide a means for collecting this charge. Thus, the potential well concept was developed, wherein a thin layer of silicon dioxide is grown on a section of silicon, and a conductive gate structure is applied over the oxide. The gate structure is formed in an array of columns and rows, thus making it possible by applying a positive electrical potential to various gate elements to create depletion regions where free electrons generated by the incoming photons can be stored.

By controlling the electrical potential applied to adjacent gates, the depletion region, or well, containing the free electrons can be caused to migrate along a column or row, so that the signal may eventually be output at the edge of the array.

Typically, the gate structure is arranged with multiple phases, particularly three phases, so that the potential wells may be easily migrated through the silicon to an output device.

In reality, the wells and the migration of the wells is not carried out along the surface of the silicon-silicon dioxide interface, but takes place in a buried channel below the surface. The buried channel is free of interference from interface states and thus assures effective charge transfer from well to well. The operation of a charge-coupled device is somewhat analogous to that of a bucket brigade circuit commonly used to delay electrical signals.

Because the charge from the wells located far from an output amplifier must undergo hundreds of transfers, the charge transfer efficiency of a charge-coupled device is most important, as is the quantum efficiency and the spectral response. These considerations are particularly important when extremely low light levels are to be sensed.

Light normally enters the charge-coupled device by passing through the gates in the silicon dioxide layer. The gates are usually made of very thin polysilicon, which is reasonably transparent to long wavelengths but becomes opaque at wavelengths shorter than 400 nm. Thus, at short wavelengths, the gate structure attenuates incoming light.

In an effort to overcome this difficulty, it has become the practice to uniformly thin a charge-coupled device to a thickness of approximately 10 um, using acid etching techniques. Using a thinned charge-coupled device, it then becomes possible to focus an image on the backside of the charge-coupled device, where there is no gate structure that will attenuate the incoming light. Thinned charge-coupled devices exhibit high sensitivity to light from the soft X-ray to the near-infrared region of the spectrum.

FIG. 1A illustrates schematically a cross-section of a typical thick-bodied charge-coupled device. The device includes a silicon body 2, a silicon dioxide layer 4 and a gate array 6 formed on the silicon dioxide layer. Incoming light is illustrated by arrows 8 as illuminating a front side of the silicon 2. FIG. 1B illustrates a cross-section of a thinned charge-coupled device with light illuminating a backside. The thinned charge-coupled device, having a thickness of approximately 10 um, has improved quantum efficiency and UV spectral response.

Conventional charge-coupled device thinning was performed using chemical etchants, such as an acid mixture of hydrofluoric, nitric and acetic (HNA) acids, or potassium hydroxide; however, these reagents leave the silicon surface roughened with variations of approximately 500Å and frequent etch pits. The resulting surface was severely wrinkled, and if flattened by attaching to a support structure, significant non-planarity remained. Such non-planarity degraded performance, especially when used in fast (small f number) optical systems. With this thinning technique a thick (500 um) border region or hoop structure is required for device handling and for wire bonding to the device's electrical contacts, since the thinned material is much too fragile for either of these operations. The hoop region, therefore, is purposely marked off during device processing to prevent its being etched or thinned. Potassium hydroxide is an anisotropic etchant and therefore only etches the silicon directly behind the pixels, which results in a rectangular membrane attached to a rectangular hoop of silicon, as illustrated in FIG. 1B. This structure does not require mechanical support for thinning; however, it results in a somewhat buckled, non-planar charge-coupled device silicon membrane.

In general, the chemical etchants are extremely strong and have varying reaction rates, thereby making it difficult to control the rate of etching, resulting in very poor yields.

The techniques used for wet etching with the chemical etchants required that the pixel face of the charge-coupled device be protected during the chemical etching; typically, the pixel face of the charge-coupled device is waxed to a support substrate, while the back is etched. Thereafter, the charge-coupled device is transferred to a second, optically-transparent, substrate to provide proper support. This technique has two major drawbacks. Firstly, the excessive handling required significantly increases the possibility of damaging the charge-coupled device. Secondly, the backside of the charge-coupled device, which is mounted to an optically-transparent substrate, has two layers through which light must pass under normal use, thereby causing additional attenuation.

SUMMARY OF THE INVENTION

The present invention contemplates a method for thinning a charge-coupled device, which method overcomes the drawbacks of the prior art. A standard thick silicon charge-coupled device has its pixel face mounted to a transparent glass substrate, which has a thermal coefficient of expansion matched to the charge-coupled device. This bonding is accomplished using a thin layer of thermoset epoxy. The backside silicon of the charge-coupled device is thinned to 10±0.5 um using a two-step chemi-mechanical process. The bulk silicon is thinned to 75 um with a 700 micro-grit aluminum oxide abrasive and is then thinned and polished to 10 um using 80 nm grit colloidal silica.

The two key developments in this process are:

1) development of a technique for uniform low-stress bonding of a silicon charge-coupled device to an optically flat glass substrate, thereby creating a compound structure which provides mechanical support to the charge-coupled device and makes thinning to 10 um or less possible with lap/polish techniques; and 2) the use of a modified high-precision lap/polish fixture to control material removal during thinning.

Access from the backside to the aluminum bonding pads of the device is achieved by photolithographic patterning and reactive ion etching of the silicon above the bonding pads. The charge-coupled device is then packaged and wire-bonded in a structure which offers support for the thin silicon/glass sandwich structure and allows for unobstructed backside illumination.

Using the method of the present invention, the thinned silicon membrane is secured to a rigid, flat, smooth glass substrate for proper support. The polishing step results in a specular, optically smooth surface devoid of surface damage or defects.

The thinned backside silicon has no overlying structure to attenuate or distort the incoming light during normal charge-coupled device use.

The packaging of the resulting charge-coupled device is straightforward, since the aluminum bonding pads are facing the package opening, in a manner similar to the situation when the gate side of the device is illuminated.

A primary objective of the present invention is to provide a method of thinning charge-coupled devices which results in improved device yield and provides a flatness of λ/2 or better.

Another objective of the present invention is to provide a thinned charge-coupled device wherein the backside may be directly illuminated without the requirement for the illumination to pass through additional supporting structures.

Another objective of the present invention is to provide a thinned charge-coupled device which is adapted to be easily mounted in a typical charge-coupled device package.

BRIEF DESCRIPTION OF THE DRAWINGS

FIGS. 1A and 1B are cross-section illustrations of thick and thinned charge-coupled devices, respectively.

FIGS. 2a-2e illustrate the basic steps of the present invention.

FIG. 5 is a partial cross-section of a thinned charge-coupled device with the aluminum bonding pads exposed.

FIG. 6 is a time-temperature schedule for the curing of the epoxy which bonds the charge-coupled device to the glass substrate.

DETAILED DESCRIPTION OF THE INVENTION

Figure 3:
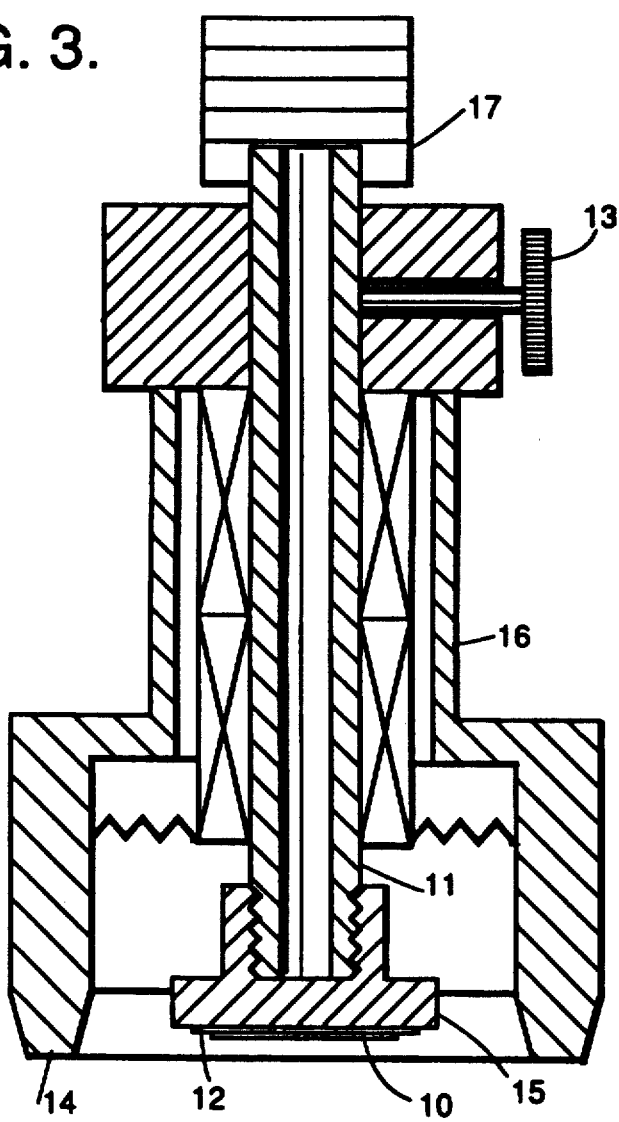
FIG. 3 schematically illustrates a fixture used in the present invention for lapping and polishing.

The present invention starts with a standard, commercially-available thick charge-coupled device which may be purchased in wafer form, said wafer including a plurality of devices. The device selected for the practice of the present invention is an FA1024L Scientific Imager produced by Ford Aerospace, now Loral, which is a three-phase 1024×1024 full frame imager designed for front illumination. Candidate devices are probed at the wafer level, and operative devices are selected.

After selection, the wafer is waxed to a support structure and is diced on a wafer dicing saw, as indicated in step 1 shown by FIG. 2a. After dicing, the die are washed thoroughly in trichloroethylene to remove all wax residue used in dicing. This is followed by an acetone wash and propanol rinse.

The pixel face of the die is then optically inspected at 300×, and the location of any manufacturing blemishes are noted. These surface defects have no height, nor do they affect device performance, but are noted at this point so that they are not judged particulate contamination during the subsequent bonding process. The selected die for each device are thereafter segregated and stored for later processing.

Glass substrates are then formed using 1⅛"×1⅛" squares of 80 mil thick Schott ZNK7 glass. One side of each substrate face is polished to a flatness tolerance of λ/2 or better, as measured on a 1/10 wave optical flat using a monochromatic helium light source.

The polished substrates are now washed in trichloroethylene, followed by acetone and a propanol rinse. The substrates are then stored for later processing.

In preparation for bonding, both the glass substrates and the charge-coupled device die are final cleansed by the following process. The die or substrate is first rinsed in acetone, followed by propanol (approximately 60 seconds in each rinse). It is then scrubbed using soft polypropylene pads and a 1/64 mixture of detergent-/water for approximately 3 minutes. This is followed by a 4-minute rinse in running D.I. water and blow dry using filtered, dry deionized nitrogen. The substrate or die is then inspected under a high-intensity 512 nm wafer inspection lamp, and if any particulate matter is observed, the cleaning process is repeated. When clean, both the die and the substrate are immersed in a beaker containing 0.2 um filtered propanol for storage until bonding.

The bonding step is illustrated in Step 2 shown by FIG. 2b and is preferably conducted in a Class 10 clean room. The charge-coupled device is placed pixel-face down on the glass substrate, which has been previously placed in a bonding fixture. With the charge-coupled device secured to the glass substrate, the fixture and the device/substrate combination are inverted, and the interface between the device and the substrate is inspected under 512 nm monochromatic light. If there are no particles greater than 0.5 um between the charge-coupled device and the substrate, there will be a regular series of fringes seen through the substrate, with decreasing but regular spacing towards the edge of the device. If particles exist, the fringe pattern will not be regular and even, but will encircle and be distorted by the contaminant. If the interface is free of particulates or has particulates smaller than 0.5 um, the device/substrate combination is transferred to a vacuum bonding fixture.

A small quantity, approximately 10 ul of pre-outgassed and 0.5 um filtered Epo-tech 377 epoxy is deposited next to, but not in contact with, the device on the glass substrate. The pressure in the bonding fixture is reduced to 1 um of Hg and allowed to remain at this level for 3 minutes. During this period all air is removed from between the charge-coupled device and the glass substrate. A heater within the bonding fixture is then actuated, which raises the charge coupled device/substrate temperature to 60° C. ±1° C. The bonding fixture also contains two vacuum feed-through manipulator probes; and when the 60° C. point is reached, these manipulators are used to gently push the charge-coupled device into contact with the previously-deposited 377 epoxy spot. When this contact occurs, the epoxy is rapidly drawn under the charge-coupled device by capillary action, and complete bonding occurs.

This drawing of the epoxy under vacuum prevents air bubbles from occurring between the device and the glass substrate. The vacuum is then slowly released, and the device/substrate combination is removed from the vacuum bonding fixture and transferred to a temperature-controlled hot plate and heated to approximately 80° C. for 10 minutes, and then cooled to ambient.

This heating stage solidifies the epoxy, which is partially cured, so that the epoxy layer can be inspected for voids and particles. If no voids or particles exist, the device/substrate combination is placed on a pneumatic press/heater, and the epoxy is cured as per the schedule shown in FIG. 6. After the final step in the cure schedule, the bonded charge-coupled device/glass substrate is allowed to cool for 3 hours minimum. At this point, the charge-coupled device is uniformly bonded to the optically flat glass substrate to within 0.2 um.

The bonded charge-coupled device/substrate assembly is then removed from the press heater and, after a thorough inspection, is ready for the lapping and polishing steps involved in thinning the silicon, as illustrated in Step 3 shown by FIG. 2c.

During this part of the process, the charge-coupled device is thinned from an initial thickness of 500 um to 10 um ±0.5 um, with a thickness uniformity of 0.25 um. The surface of the device has a flatness of λ/2 or better. Moreover, the device surface, from which material has been removed, is almost totally free of work damage. These results are made possible primarily through the use of a modified MI 165 lap/polish fixture, as shown in FIG. 3.

When using the lap/polish fixture shown in FIG. 3, the charge-coupled device/substrate assembly is first bonded to a work holder 15 with wax at 70° C. This work holder, which has been made of invar to prevent distortion of the charge-coupled device/substrate assembly due to expansion coefficient mismatch, is now screwed onto a draw tube 11. The exposed surface of the glass substrate 12 is then made parallel to the surface of a facing ring 14 by tilting the draw tube relative to the housing 16. This is accomplished with two micrometer tilt screws 13, only one of which is shown. The measurements which direct these adjustments and confirm the lap/polish rates are performed with an electronic gauge that has a minimum resolution of 0.1 um. Since the charge-coupled device 10 is parallel to its glass substrate 12, which is in turn parallel to the facing ring, the charge-coupled device is therefore parallel to the facing ring. During lapping or polishing, the facing ring slides on the surface of the turning lap plate. The draw tube can move vertically, and when loaded with weight 17, forces the charge-coupled device against the lap plate. Silicon is therefore lapped or polished from the backside of the charge-coupled device in a plane parallel to the pixel side of the device to within 2 seconds or arc.

The lap/polish fixture, which is now holding the charge-coupled device/substrate assembly, is placed with the work side down on the surface of a cast-iron lap plate and loaded with 1.65 KG of weight 17. As the lap plate rotates, 700 Grit (14.5 um) is fed into its surface, resulting in a silicon material removal rate of 12 ±0.5 um/minute. This method of lapping is continued until the charge-coupled device is reduced to a thickness of 75 um ±0.5 um. The fixture is then removed from the lap plate and thoroughly cleaned in running D.I. water for five minutes. The lap/polish fixture is then placed on a second lap plate, which has a polyurethane polishing pad bonded to its surface. Colloidal silica is now used as the polishing compound, which polishes the charge-coupled device to its final thickness. During this step, the lap/polish fixture is still loaded with 1.65 KG of weight, and the silicon material removal rate is 10 um ±1 um/hour. The thinning of the charge-coupled device is complete when a device thickness of 10 um has been achieved. To check this, the device/substrate assembly is removed from the work holder and thoroughly cleaned with trichloroethylene.

Figure 4:
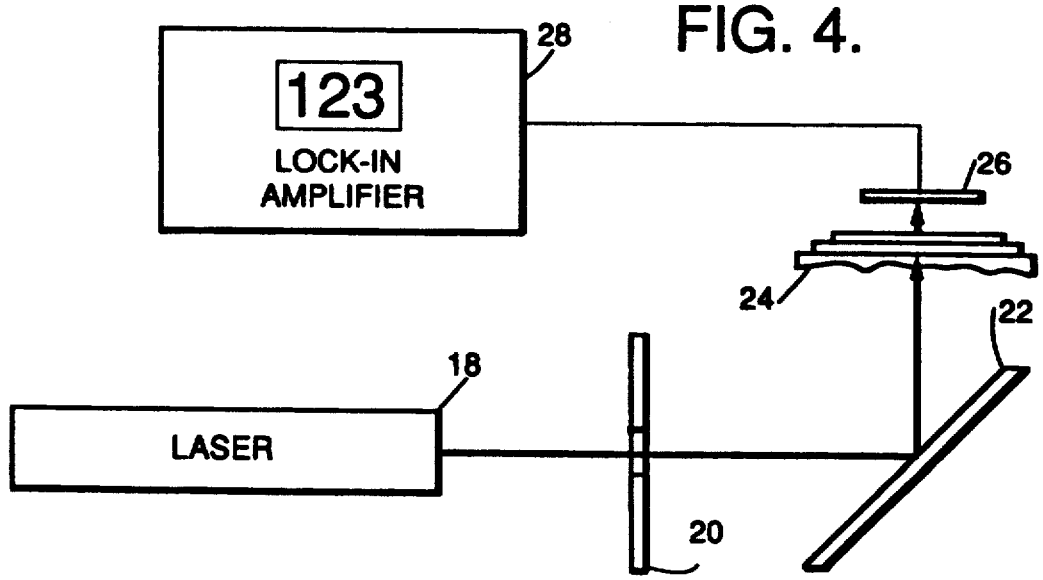
FIG. 4 illustrates a thickness measuring technique used to measure the final thickness of the thinned charge-coupled device.

The final silicon thickness is measured with a HeNe silicon laser thickness measuring instrument, as illustrated in FIG. 4. The thickness measuring instrument uses a HeNe laser 18, a chopper 20, a beam splitter 22, a movable X-Y stage 24, a silicon photodiode 26 as a detector, and a lock-in amplifier 28. The HeNe light is projected through the device/substrate combination from the glass side first, through the epoxy, silicon, and onto the photo detector. A simple calculation converts the output of the lock-in amplifier to a silicon thickness in micrometers and compensates for the glass, epoxy, air and interfaces included in the light path. If necessary, the charge-coupled device is repolished and rechecked, as previously described, until the 10 ±0.5 um thickness point is reached.

During experimentation, it was found that the variation in silicon thickness achieved when thinning eight devices was ±0.28 um, at a nominal silicon thickness of 10 um. The measuring instrument positional variation is ±0.017 um. The silicon surface roughness achieved using the polishing technique is 25 extremely low, in the low tens of Å.

After completion of the thinning step 3 shown in FIG. 2c, it is required that the bonding pads of the charge-coupled device be exposed from the backside. Since the charge-coupled device is attached to the glass substrate at its pixel face, the electrical bonding pads are buried under the silicon. To gain access to the bonding pads, the fourth step shown in FIG. 2d must be performed. This step is achieved by first lithographically patterning the backside silicon above the pads so that an etching step may take place to remove the silicon. The silicon is etched in a $CF_4/O_2$ plasma at 100 watts of power and a pressure of 2 Torr. The silicon is removed in a matter of minutes; however, the field oxide still covers the aluminum bonding pads. This silicon dioxide is etched away with a 10:1 buffered HF oxide etch.

The oxide removal must be done cautiously, since the etchant will also etch the aluminum bond pads. The oxide is fully removed when bubbling appears in the etchant. The device is then quickly rinsed to minimize any etching of the aluminum bonding pads. After the aluminum bonding pads have been exposed in Step 4 of FIG. 2d, the device/substrate combination appears as shown partially in cross-section in FIG. 5. The structure includes the glass substrate 30, an epoxy layer 32, a layer of passivation overglass 34, exposed aluminum bonding pads 36 and the remainder of the thinned silicon body 38.

After exposure of the bonding pads, the device is ready to be cut to size, as shown in Step 5 shown in FIG. 2e. The cutting of the charge-coupled device assembly to the final size is carried out using a MicroAutomation dicing saw, so that the final assembly dimensions are 0.70 inches square. The assembly may then be mounted in a PI-4596S package obtained from Augat/Isotronics. The device is mounted so that the thinned backside silicon face is directed towards the open face of the package. The aluminum bonding pads may then be easily wire-bonded to the package pins using standard wire-bonding techniques.

In view of the above, it is apparent that the present invention provides a charge-coupled device for imaging, wherein the rear surface is smoothly thinned so as to receive light from the image to be recorded, said light not being distorted or significantly attenuated while passing through the thinned silicon material. The device, having a planar structure, may be easily mounted into a standard, commercially-available package.

What is claimed is:

1. A method for forming a thinned charge-coupled device, said method comprising the steps of:
    obtaining a charge-coupled device having a thickness greater than a preselected thickness, said charge-coupled device having a front pixel side and a backside;
    uniformly and permanently bonding, under a vacuum, said front side of said charge-coupled device to an optically flat glass substrate so that said charge-coupled device is supported while said backside is thinned, said optically flat glass substrate having front and back faces said front face being bonded to said front side of said charge-coupled device; and
    thinning said charge-coupled device to said preselected thickness using a two-step chemi-mechanical process including a lapping step and a polishing step.

2. A method as described in claim 1, wherein said charge-coupled device and said optically flat glass substrate are bonded together so as to effect parallelism between pixels of the charge-coupled device and an optically flat surface of the substrate.

3. A method as described in claim 2, wherein said optically flat surface serves as a reference plane from which device thinning is controlled.

4. A method as described in claim 1, wherein the lapping step is used to reduce the thickness of the charge-coupled device to approximately 75 um.

5. A method as described in claim 4, wherein the lapping step is accomplished using an alumina grit having an approximate 700 micro-grit particle size.

6. A method as described in claim 1, wherein the polishing step is achieved using a colloidal silica abrasive.

7. A method as described in claim 6, wherein the colloidal silica has a particle size of approximately 80 nm.

8. A method as described in claim 7, wherein colloidal silica is used in conjunction with a polyurethane polishing pad.

9. A method as described in claim 1, wherein the charge-coupled device is uniformly bonded to a transparent optically flat glass substrate having a coefficient of expansion matched to that of the charge-coupled device.

10. A method as described in claim 9, wherein the charge-coupled device is uniformly bonded to the optically flat glass substrate using a thermoset epoxy.

11. A method as described in claim 1, additionally comprising the step of, after thinning said charge-coupled device, removing material from the backside of the charge-coupled device using etching techniques to expose bonding pads embedded in the device.

12. A method as described in claim 11, wherein the backside of the thinned charge-coupled device is photolithographically patterned and the etching is achieved using an ion etching technique.

13. A method as described in claim 12, additionally comprising the steps of mounting the thinned charge-coupled device in a package and wire-bonding the bonding pads to contact pins of said package.

14. A method as described in claim 1, wherein the glass substrate includes front and back faces, and the method additionally comprises the step of polishing said front faces.

15. A method as described in claim 1, wherein the charge-coupled device is mounted to the glass substrate in a bonding fixture and an interface between the charge-coupled device and the substrate is inspected under monochromatic light to detect the existence of particles by viewing a fringe pattern formed by the light.

16. A method as described in claim 15, wherein said bonding step is accomplished in a vacuum fixture, and the method includes the steps of:
    placing the charge-coupled device/substrate combination in the vacuum fixture;
    depositing the epoxy on the substrate adjacent the charge-coupled device;
    evacuating the fixture, so that the vacuum removes all air from between the charge-coupled device and the glass substrate and volatile organics from the epoxy;
    warming the charge-coupled device/substrate;

moving the charge-coupled device on the glass substrate to the epoxy, causing the epoxy to be contacted and drawn under the charge-coupled device by capillary action;

releasing the vacuum; and heating the charge-coupled device/substrate combination to partially cure the epoxy.

17. A method as described in claim 16, additionally comprising the steps of:

inspecting the charge-coupled device/substrate combination and the epoxy layer for voids and unwanted particles; and thereafter finally curing the epoxy using a pneumatic press heater and a preselected time-temperature cure schedule.

18. A method as described in claim 1, additionally comprising the step of measuring the thickness of the thinned charge-coupled device using a laser thickness measuring instrument.

* * * * *